United States Patent [19]

Heuber et al.

[11] 4,024,417

[45] May 17, 1977

[54] INTEGRATED SEMICONDUCTOR STRUCTURE WITH MEANS TO PREVENT UNLIMITED CURRENT FLOW

[75] Inventors: Klaus Heuber, Boeblingen; Knut Najmann, Gaertringen; Rolf Remshardt, Boeblingen; Klaus Tertel, Altdorf, all of Germany

[73] Assignee: International Business Machines Corporation, Armonk, N.Y.

[22] Filed: Dec. 19, 1975

[21] Appl. No.: 642,434

[30] Foreign Application Priority Data

Apr. 3, 1975 Germany .................. 2514466

[52] U.S. Cl. .................. 307/303; 307/200 A; 357/48
[51] Int. Cl.² .................. H02H 11/00; H01L 27/04
[58] Field of Search .................. 357/40, 51, 48; 307/202 R, 303, 296, 87; 317/31

[56] References Cited

UNITED STATES PATENTS

| | | | |
|---|---|---|---|
| 3,541,357 | 11/1970 | Kram | 357/48 |
| 3,725,675 | 4/1973 | Olsen | 317/31 |
| 3,860,461 | 1/1975 | Robinette, Jr. | 357/51 |

FOREIGN PATENTS OR APPLICATIONS 886,210  11/1971  Canada .................. 317/31

OTHER PUBLICATIONS

Agusta, "DC Bias for Epi Pocket Pulse Applications", IBM Technical Disclosure Bulletin, vol. 13, No. 6, Nov. 1970, p. 1645.

*Primary Examiner*—Andrew J. James
*Assistant Examiner*—James W. Davie
*Attorney, Agent, or Firm*—Francis J. Thornton

[57] ABSTRACT

This describes an integrated semiconductor structure having an epitaxial semiconductor layer, divided into regions by isolation zones and containing active and passive semiconductor devices, of a first conductivity type on a substrate of the opposite second conductivity type. A reference potential and first and second supply voltages are applied to the structure. An additional isolated transistor, in accordance with this invention prevents an unlimited current flow, via the chip isolation junction, from one voltage supply to the other when the power-on sequence for both voltages is undefined. The base of this additional transistor is connected to one of the voltages via an integrated resistor while the other voltage is connected to the emitter and the collector is connected to the substrate via the isolation zone. Thus, the isolation junction can never become forward biased. In addition, this arrangement ensures that the substrate potential is independent of the rate of the above-mentioned substrate current, and perfect isolation is guaranteed under all conditions.

1 Claim, 6 Drawing Figures

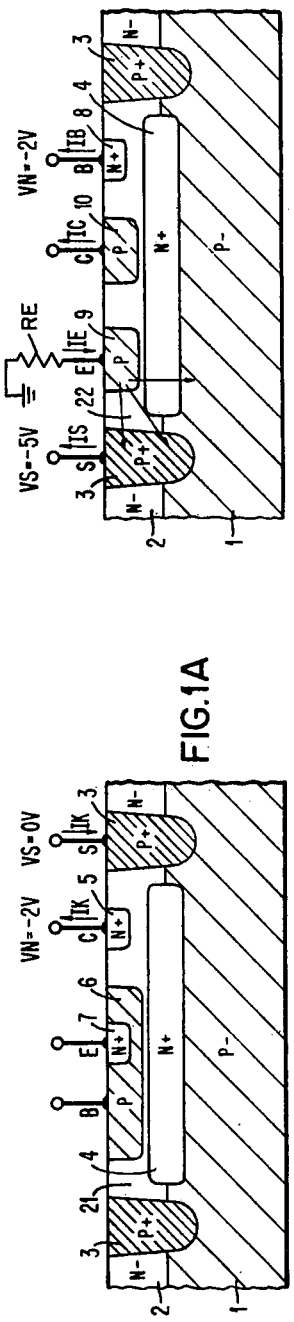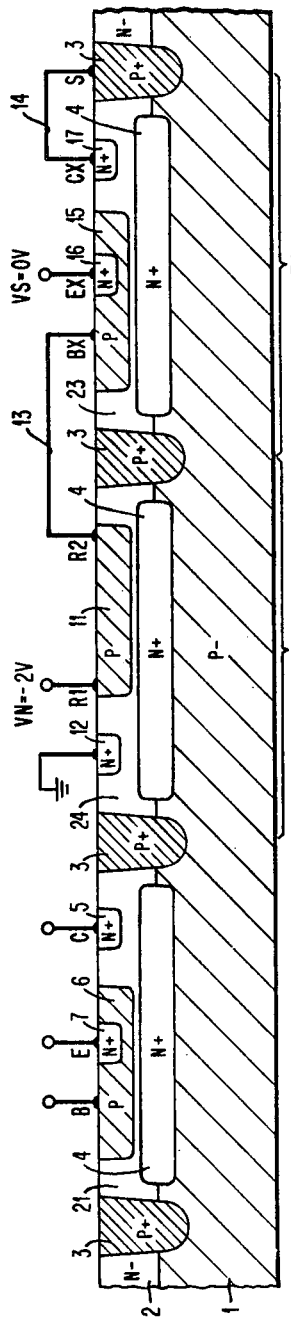

INTEGRATED SEMICONDUCTOR STRUCTURE WITH MEANS TO PREVENT UNLIMITED CURRENT FLOW

BACKGROUND OF THE INVENTION

1. Field of the Invention

The invention relates generally to an integrated semiconductor structure having an epitaxial semiconductor layer, divided into regions by isolation zones and containing the active and passive semiconductor devices, of a first conductivity type formed on a substrate of a second conductivity type. A reference potential, and first and second supply voltages are applied to the structure.

2. Description of the Prior Art

Such layered, isolated, integrated semiconductor structures are known to the prior art and contain specific devices and circuits integrated in the isolated regions.

In the selection of the operating voltage to be applied to the devices and circuits of such structures certain conditions have to be observed. One condition is obvious, i.e. to select the operating voltage in such a manner that the circuits work correctly. Other conditions require that isolation be provided between the individual circuits and devices and that this isolation be ensured under all operating conditions and that there be no inadmissible substrate currents. Taking these points into specific consideration the prior art structures will now be discussed with more detail. Generally, a P-conductive substrate is coated with an N-conductive epitaxial layer in which the actual devices and circuits are formed. In such a structure the isolation consists of highly doped, P$^+$-conductive isolation zones passing through the epitaxial layer down into the substrate. Thus, the isolation of individual regions of the epitaxial layer is achieved laterally through the PN-junction isolation diodes formed by the P$^+$-conductive isolation zones with the N-conductive epitaxial layer, and vertically, through the PN-junction formed between the N-conductive epitaxial layer and the P-conductive substrate. In order to ensure isolation of the individual regions the respective PN-junction diodes have to be reverse biased. This is accomplished in the prior art for example, by applying to the substrate a first supply voltage which is negative with respect to a reference potential applied to the P$^+$-conductive isolation zones. As a supply voltage for the circuit itself the prior art uses a second supply voltage having a value between the reference potential and the first supply voltage. Thus, the first supply voltage applied at the substrate or the isolation zone, respectively, is more negative than the second supply voltage and assures that the isolating PN-junction diodes are reversed biased.

However, during turn on, the operation voltages, i.e. the first and second supply voltages, can rise with differing speeds. Thus, for example the second supply voltage may rise to its final value while the first supply voltage is still below its final value and may be insufficient to ensure reverse biasing of the isolation diodes. In such a condition the isolation diodes are forward biased and a short-circuit ensues. The short-circuit current thus flowing can destroy the semiconductor structure.

One method for avoiding this problem requires that the second supply voltage be applied only after the first supply voltage has reached its final value thus ensuring that the isolation diodes are reversed biased. This successive application of the voltages requires a highly complex current supply unit.

For some specific circuits it is possible to avoid this problem by providing a protective resistor between the substrate and the substrate voltage. This protective resistor limits the short-circuit currents. This solution is shown in the "IBM Technical Disclosure Bulletin", Vol. 11, No. 7, December, 1968, p. 866.

This latter simple solution cannot be applied in many modern semiconductor structures. Frequently, these modern semiconductor structures are complicated with lateral PNP transistors and vertical, saturated NPN transistors that save space, and thus increase the packing density of the circuits. Often these modern semiconductor arrangements, require for normal operation substrate currents caused by parasitic transistors. As these substrate currents vary considerably in their magnitude, inserted, protective resistors would cause uncontrollable voltage drops which could jeopardize the functioning of the arrangement.

SUMMARY OF THE INVENTION

Accordingly it is the object of the invention to provide a solution for the given semiconductor structures which during the power-on sequence will prevent shortcircuit currents, and which during normal operation, in spite of varying substrate currents will exclude uncontrollable variations of the substrate potential.

This is achieved in an integrated, bipolar semi-conductor structure having an epitaxial semiconductor layer, of a first conductivity type, divided into regions by isolation zones, formed on a substrate of the opposite second conductivity type. This structure has applied thereto a reference potential, a first supply voltage, and a second supply voltage. In this structure the semiconductor layer forms the collector region of a transistor and contains the base and emitter regions. The second supply voltage is applied to the base via an ohmic resistor, the first supply voltage is applied to the emitter and the collector is conductivity coupled to the substrate and to the reference potential.

The invention ensures, that in normal operation, the substrate potential, in spite of a strongly varying substrate current remains fixed at the lowest voltage. A perfect blocking of all isolation diodes is thus guaranteed. At the same time, a short-circuit is prevented during the power-on sequence. The structure required to accomplish this is very uncomplicated and need be provided only once for each semiconductor chip.

DESCRIPTION OF THE DRAWINGS

The invention will be described below in detail with the accompanying drawings in which:

FIG. 1A illustrates a known vertical transistor structure,

FIG. 1B illustrates a known lateral transistor structure,

FIG. 2a shows an embodiment of the present invention during the power on sequence, FIG. 2b shows the embodiment of FIG. 2a during normal operation.

DESCRIPTION OF THE PREFERRED EMBODIMENT

Figure 3:
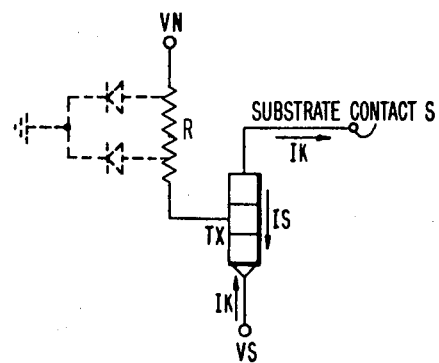
FIG. 3 illustrates the equivalent circuit diagram of the invention as shown in FIGS. 2A and 2B.

FIG. 1A shows a prior art isolated vertical transistor structure which is standard in modern high integration technology and which demonstrates the problem occurring upon the power on sequence. Onto a P⁻-conductive semiconductor substrate 1 an epitaxial semiconductor layer 2 is applied. In this epitaxial layer 2 the active and passive elements of the semiconductor arrangement are formed. A transistor structure is formed in a region of semiconductor layer 2 which is limited by the P⁺-conductive isolation 3 and the P⁻-conductive substrate 1. This defined region of semiconductor layer 2 forms the collector 21 of the transistor to which a collector electrode C is applied via an N⁺-conductive collector contact 5. Between the P⁻-conductive substrate 1 and collector 21 and N⁺-conductive subcollector 4 is provided. Within collector 21 there is formed a P-conductive base 6, with a base electrode B, which contains the N⁺-conductive emitter 7, with the emitter electrode E. The P⁺-conductive isolation 3 which reaches through epitaxial layer 2 into the P⁻-conductive substrate 1, is equipped with a substrate electrode S. With the polarities (NPN transistor) assumed in the present example, the first supply voltage VS is applied to the substrate electrode S and the second supply voltage VN is applied to collector electrode C.

Figure 4:
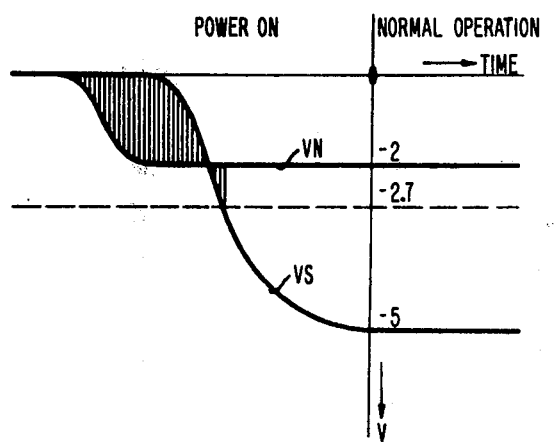
FIG. 4 shows the curves of the supply voltages during the power on sequence and in normal operation.

In normal operation the second supply voltage VN = −2 Volts is applied to collector electrode C, and the first supply voltage VS = −5 Volts is applied to substrate electrode S. It is evident that under these circumstances the isolation diodes formed between the P⁺-conductive isolation zone 3, i.e. the P⁻-conductive substrate 1 and the N⁻-conductive semiconductor layer 2, are operated in the reverse direction and thus effect the isolation of the transistor. However, if the voltage supplies have differing turn on times then, as shown in FIG. 4, during the power on sequence it can happen that the first supply voltage VS is still zero while the second supply voltage VN has already reached the value of −2 Volts. When this occurs the isolation diodes are biased in the forward direction, and a short-circuit current IK flows via isolation zone 3 or substrate 1, respectively, to collector electrode C. This short-circuit current IK flowing during the power-on sequence can destroy the semiconductor structure. The flowing of this short circuit current can be avoided, in accordance with the prior art, only by a successive application of the operation voltages, i.e. applying the first supply voltage VS before applying the second supply voltage VN, or by inserting a protective resistor.

However, as shown by the structure according to FIG. 1, the installation of such a resistor is not possible when in the integrated semiconductor structures varying substrate current flow is used in normal operation.

The transistor of FIG. 1B is not a vertical NPN transistor, but a lateral PNP transistor. In this lateral transistor, that region of the epitaxial semiconductor layer 2 which is isolated by isolation 3 serves as a base 22 having an N⁺ base connection 8 and base electrode B. Emitter 9 and collector 10 are two P-conductive semiconductor zones laterally arranged to each other in the 22, with corresponding emitter and collector electrodes E and C. In all other features the structure corresponds to that of FIG. 1A. The first supply voltage VS is applied to substrate electrode S, a ground potential is applied via a resistor RE to emitter electrode E, and the second supply voltage VN is applied to base electrode B. The transistor carries currents corresponding to its normal state of operation, i.e. emitter current IE, collector current IC, and base current IB. Owing to the construction existing parasitic transistors carry substrate currents IS in normal operation. One such parasitic transistor is comprised of Emitter 9 which injects carriers through the base 22 into the isolation zone 3 and the substrate 1, which serve as a collector. Thus a substrate current IS flows via substrate electrode S. A similar substrate current is also found in saturated, vertical transistor structures.

The problem described above which appears during the power on sequence cannot be solved by the insertion of a protective resistor between the supply VS and the substrate electrode S, because the varying substrate current IS would cause voltage drops and consequently undefinded substrate potentials.

The present invention, which ensures that during normal operation of an integrated circuit structure the substrate potential, in spite of strongly varying substrate currents IS, is not changed and that during the power on sequence the short-circuit current IK is prevented, is shown in FIGS. 2A and 2B. Both figures show the same embodiment, but in FIG. 2A the voltages shown are those that may appear during the critical power-on sequence, and in FIG. 2B the voltages shown are those applied in normal operation. In the left-part region of the two figures, FIGS. 2A and 2B, there is, the vertical transistor structure having a base 21 described in connection with FIG. 1A which may be, for example, a part of an integrated circuit. The same reference symbols are used for this transistor in all the Figures and the description of this transistor will not be repeated.

The invention needs to be provided only once on every semiconductor chip and comprises, as shown in FIGS. 2A and 2B, an integrated resistor R and a transistor TX.

Both the resistor R and the transistor TX are formed in isolated regions of the epitaxial N⁻-conductive layer 2 which are formed by isolation zones 3. The structure of transistor TX corresponds to the vertical NPN transistor of FIG. 1A and has an N⁺-conductive subcollector 4, a N⁻-conductive collector 23, an N⁺-conductive contact 17, a P⁻-conductive base 15, and a N⁺-conductive emitter 16. Transistor TX is further provided with a base electrode BX, an emitter electrode EX, and a collector electrode CX. Resistor R is comprised of a P-conductive zone 11, similar to the base 15 of transistor TX, which is provided within the isolated region 24 of the epitaxial N⁻-conductive semiconductor layer 2. This isolated region 24 is connected to a reference potential, in this case ground, via an N⁺-conductive contact 12. One supply voltage VN is applied to a first electrode R1 contacting one end of zone 11. Contacting the other end of zone 11 is a second electrode R2 which is connected via a line 13 to base electrode BX of transistor TX. To emitter electrode EX the other supply voltage VS is applied. Collector electrode CX is connected to substrate contact S via a line 14.

The equivalent diagram of the arrangement of Resistor R and transistor TX, as disclosed by the invention is shown in FIG. 3. Supply voltage VN is applied, via resistor R, to the base of transistor TX while supply voltage VS is applied to the emitter of the transistor. The collector of the transistor is connected to isolation zone 3 and thus to substrate 1. The diodes drawn in dashed lines between resistor R and ground correspond to the back biased junction between P-conductive resistance zone 11 and the N⁻-conductive isolated region 24 of semiconductor layer 2. The effect of the arrangement as disclosed by the invention will now be studied first during the critical power-on sequence, and subsequently in normal operation. It will be assumed that during the power-on sequence there is the critical situation where one supply voltage VN has already reached its final value of −2 Volts, and the other supply voltage VS has not yet turned on, as shown in FIG. 4. Under these conditions transistor TX is non-conductive and thus no short circuit current can flow even though the other supply voltage VS, applied to the emitter of transistor TX, has not turned on. Transistor TX is non-conductive in both directions as long as supply voltage VS is more positive than the difference between supply voltage VN and base-emitter voltage VBE for the conductive transistor TX, i.e. in the present example more positive than abt. −2.7 Volts.

As long as the supply voltage VN is the most negative voltage applied the collector-base junction of the transistor TX is also non-conductive.

In normal operation the voltage conditions shown in FIG. 2B supply, that is, the supply voltage VN = −2 Volts, and the supply voltage VS + −5 Volts.

The arrows IS″ shown across region 21 in the NPN transistor structure belonging to the integrated circuit indicate that in normal operation there flows differing substrate currents via parasitic transistors. The invention, using the already described resistor R and transistor TX permits this flowing substrate current IS″, while maintaining the substrate potential at a fixed value.

The base current of the transistor TX is limited even while the transistor is in saturation because the supply voltage VN is supplied to the base through the resistor R. The supply voltage VS is connected to the emitter electrode EX and thus the collector which is connected to the substrate through collector contact 17, collector electrode CX, line 14 and isolation 3 is higher than the supply voltage VS by an amount equal to the collector emitter voltage of the transistor TX. Because the substrate potential is higher by the collector emitter voltage, substrate currents IS″ do not affect it. Also this always assures that the isolations are reversed biased.

Thus control is achieved automatically by the described application of the voltages VN and VS. No other control circuits are required.

While the invention has been particularly shown and described with reference to a preferred embodiment thereof, it will be understood by those skilled in the art that various changes in forms and in detail may be made therein without departing from the spirit and scope of the invention.

What is claimed is:

1. An integrated semiconductor structure comprising a semiconductor substrate of a first conductivity type,
   an epitaxial layer of a second conductivity type on said substrate and forming a rectifying junction therewith,
   isolation zones of said first conductivity type extending through said layer and electrically separating said layer into electrically distinct regions and forming a rectifying junction with said regions,
   a base diffusion, an emitter diffusion and a collector contact diffusion in a first one of said regions to form a first bipolar transistor in said first one of said regions
   a resistor formed in a second one of said regions,
   first direct current voltage means coupled to said base diffusion through said resistor,
   Second direct current voltage means coupled to said emitter diffusion,
   a base diffusion, an emitter diffusion and a collector contact diffusion in a third one of said regions to form a second bipolar transistor in said third one of said regions, and
   conductive means interconnecting said collector contact diffusion of said first bipolar transistor to said isolation zones to reverse bias said rectifying junction between said isolation zones and said regions to prevent unlimited current flow via said isolation junction when supply voltages are applied to the integrated structure.

* * * * *